United States Patent
Pelrine et al.

(10) Patent No.: US 6,707,236 B2
(45) Date of Patent: Mar. 16, 2004

(54) NON-CONTACT ELECTROACTIVE POLYMER ELECTRODES

(75) Inventors: Ronald E. Pelrine, Boulder, CO (US); Roy D. Kornbluh, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 25 days.

(21) Appl. No.: 10/059,033

(22) Filed: Jan. 29, 2002

(65) Prior Publication Data

US 2003/0141787 A1 Jul. 31, 2003

(51) Int. Cl.[7] .................................................. H02N 2/00
(52) U.S. Cl. ........................................................ 310/800
(58) Field of Search ......................................... 310/800

(56) References Cited

U.S. PATENT DOCUMENTS

| | | | |
|---|---|---|---|
| 4,689,614 A | * 8/1987 | Strachan ..................... 345/173 |
| 4,704,556 A | * 11/1987 | Kay ............................ 310/334 |
| 4,885,783 A | 12/1989 | Whitehead et al. |
| 4,906,886 A | * 3/1990 | Breimesser et al. ........ 310/334 |
| 5,591,986 A | 1/1997 | Niigaki et al. |
| 5,744,908 A | 4/1998 | Kyushima |
| 5,788,468 A | 8/1998 | Dewa et al. |
| 5,883,466 A | 3/1999 | Suyama et al. |
| 5,912,499 A | 6/1999 | Diem et al. |
| 5,914,901 A | 6/1999 | Pascucci |
| 5,977,685 A | 11/1999 | Kurita et al. |
| 6,037,707 A | 3/2000 | Gailus et al. |
| 6,055,859 A | 5/2000 | Kozuka et al. |
| 6,060,811 A | 5/2000 | Fox et al. |
| 6,075,504 A | 6/2000 | Stoller |
| 6,094,988 A | * 8/2000 | Aindow ......................... 73/649 |
| 6,097,821 A | 8/2000 | Yokoyama et al. |
| 6,108,275 A | 8/2000 | Hughes et al. |
| 6,140,131 A | 10/2000 | Sunakawa et al. |
| 6,184,608 B1 | 2/2001 | Cabuz et al. |
| 6,201,398 B1 | 3/2001 | Takada |
| 6,249,076 B1 | 6/2001 | Madden et al. |
| 6,252,221 B1 | 6/2001 | Kaneko et al. |
| 6,297,579 B1 | * 10/2001 | Martin et al. ................ 310/330 |
| 6,321,428 B1 | * 11/2001 | Toda et al. .................. 29/25.35 |
| 6,333,595 B1 | 12/2001 | Horikawa et al. |
| 6,334,673 B1 | 1/2002 | Kitahara et al. |

OTHER PUBLICATIONS

Bar–Cohen, Yoseph, JPL, *WorldWide ElectroActive Polymers, EAP (Artificial Muscles) Newsletter*, vol. 3, No. 1, Jun. 2001.

Bharti, V., Z.–Y. Cheng, S. Gross, T.–B. Xu, and Q. M. Zhang, "High electrostrictive strain under high mechanical stress in electron–irradiated poly(vinylidene fluoride–trifluorethylene) copolymer," *Appl. Phys. Lett.* vol. 75, 2653–2655 (Oct. 25, 1999).

Bharti, V., H. S. Xu, G. Shanthi, and Q. M. Zhang, "Polarization and Structural Properties of High Energy Electron Irradiated Poly(vinylidene fluoride–trifluoroethylene) Copolymer Films," to be published in J. Appl. Phys. (2000).

(List continued on next page.)

Primary Examiner—Thomas M. Dougherty
(74) Attorney, Agent, or Firm—Beyer Weaver Thomas LLP

(57) ABSTRACT

The invention relates to systems and methods for electrically communicating with an electroactive polymer using one or more electrodes that do not contact the polymer. A non-contact electrode communicates charge to or from a portion of the polymer, typically through a medium. For example, the medium may include air, a vacuum, or a specialized gas that facilitates transfer of charge between the electrode and the polymer. The charge may include positive or negative ions or electrodes and may act to actuate the polymer, or diminish actuation applied to polymer in one or more specific polymer portions.

44 Claims, 7 Drawing Sheets

OTHER PUBLICATIONS

Calvert, P. and Z. Liu, "Electrically stimulated bilayer hydrogels as muscles," Proceedings of the SPIE International Symposium on Smart Structures and Materials: Electro–Active Polymer Actuators and Devices, Mar. 1–2, 1999, Newport Beach, California, USA, pp. 236–241.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Kornbluh, R., R. Pelrine, Jose Joseph, Richard Heydt, Qibing Pei, Seiki Chiba, 1999. "High–Field Electrostriction Of Elastomeric Polymer Dielectrics For Actuation", Proceedings of the SPIE International Symposium on Smart Structures and Materials: Electro–Active Polymer Actuators and Devices, Mar. 1–2, 1999, Newport Beach, California, USA. pp. 149–161.

Kornbluh, R., R. Pelrine, Q. Pei, S. Oh, and J. Joseph, 2000. "Ultrahigh Strain Response of Field–Actuated Elastomeric Polymers," Proceedings of the 7th SPIE Symposium on Smart Structures and Materials–Electroactive Polymers and Devices (EAPAD) Conference, Mar. 6–8, 2000, Newport Beach, California, USA, pp. 51–64.

Kornbluh, R., Pelrine, R. Joseph, J., Pei, Q. and Chiba, S., "Ultra–High Strain Response of Elastomeric Polymer Dielectrics", Proc. Materials Res. Soc., Fall meeting, Boston, MA, pp. 1–12, Dec. 1999.

Liu, Y., T. Zeng, Y.X. Wang, H. Yu, and R. Claus, "Self–Asembled Flexible Electrodes on Electroactive Polymer Actuators," Proceedings of the SPIE International Symposium on Smart Structures and Materials: Electro–Active Polymer Actuators and Devices, Mar. 1–2, 1999, Newport Beach, California, USA., pp. 284–288.

Liu, C., Y. Bar–Cohen, and S. Leary, "Electro–statically stricted polymers (ESSP)," Proceedings of the SPIE International Symposium on Smart Structures and Materials: Electro–Active Polymer Actuators and Devices, Mar. 1–2, 1999, Newport Beach, California, USA., pp. 186–190.

Pelrine et al., "Electroactive Polymer Electrodes", U.S. patent application No. 09/619,843, filed Jul. 20, 2000, 54 pages.

Pelrine, R., R. Kornbluh, and J. Joseph, "Electrostriction of Polymer Dielectrics with Compliant Electrodes as a Means of Actuation," Sensors and Actuators A: Physical, vol. 64, 1998, pp. 77–85.

Pelrine, R, R. Kornbluh, J. Joseph, and S. Chiba, "Electrostriction of Polymer Films for Micractuators," Proc. IEEE Tenth Annual International Workshop on Micro Electro Mechanical Systems, Nagoya, Japan, Jan. 26–30, 1997, pp. 238–243.

Pelrine R., R. Kornbluh, and J. Joseph, FY 1998 Final Report on Artificial Muscle for Small Robots, ITAD–3482–FR–99–36, SRI International, Menlo Park, California, 1999.

Pelrine, R., R. Kornbluh, and J. Joseph, FY 1999 Final Report on Artificial Muscle for Small Robots, ITAD–10162–FR–00–27, SRI International, Menlo Park, California, 2000.

Pelrine, R., R. Kornbluh, Q. Pei, and J. Joseph, "High Speed Electrically Actuated Elastomers with Over 100% Strain," Science, vol. 287, No. 5454, pp. 1–21, 2000.

Pelrine, R., J. Eckerle, and S. Chiba, "Review of Artificial Muscle Approaches," invited paper, in Proc. Third International Symposium on Micro Machine and Human Science, Nagoya, Japan, Oct. 14–16, 1992.

Shahinpoor, M., "Micro–electro–mechanics of Ionic Polymer Gels as Electrically Controllable Artificial Muscles," J. Intelligent Material Systems and Structures, vol. 6, pp. 307–314, May 1995.

Zhang, Q., V. Bharti, and X. Zhao, "Giant Electrostriction and Relaxor Ferroelectric Behavior in Electron–irradiated Poly(vinylidene fluoride–trifluoroethylene) Copolymer," Science, vol. 280, pp. 2101–2104 (Jun. 26, 1998).

Pelrine, R., R. Kornbluh, J. Eckerle "Monolithic Electroactive Polymers" U.S. patent application No. 09/779,203 filed Feb. 7, 2001.

Pelrine et al., "Electroactive Polymer Generators", U.S. patent application No. 09/619,848, filed Jul. 20, 2000, 69 pages.

Pelrine, R. R.. Kornbluh, J. Eckerle, S. Stanford, S. Oh and P. Garcia, "Biologically Powered Electroactive Polymer Generators", U.S. patent application No. 09/792,877, filed Feb. 23, 2001.

Kornbluh, R., R. Pelrine, Q. Pei and J. Eckerle "Electroactive Polymer Sensors", U.S. patent application No. 10/007, 705, filed Dec. 6, 2001.

Kornbluh, R., R. Pelrine, Q. Pei and V. Shastri "Electroactive Polymer (EAP) Actuators as Artificial Muscles—Reality, Potential and Challenges", Chapter 16, available from SPIE Press on May 2001.

* cited by examiner

NON-CONTACT ELECTROACTIVE POLYMER ELECTRODES

BACKGROUND OF THE INVENTION

The present invention relates generally to electroactive polymer technology. More particularly, the present invention relates to an electrode used to electrically communicate with an electroactive polymer that does not contact the polymer.

Electroactive polymer transducer technology relies on a polymer that converts between mechanical and electrical energy. Compliant electrodes are attached to opposing sides of the polymer to permit electrical communication with the polymer.

Often, it is desirable to actuate different portions of a polymer without using electrodes that contact the polymer. For example, many conventional electrodes introduce surface roughnesses that are undesirable for some applications. The opaque nature of many contact electrodes may also interfere with the optical performance of a transparent electroactive polymer. Alternately, some electroactive polymer transducers employ multiple active areas, each with a customized shape, deflection, and dedicated set of contact electrodes that permit independent electrical control. Currently, the wiring resolution of each set of contact electrodes limits the number of active areas that can be used, and the size of each active area in an array. In addition, many electroactive polymers operate at high-voltages that increase switching complexity, for example, by requiring transistor cascades that are sometimes prohibitively expensive or spacious.

In view of the foregoing, an alternative form of electrically communicating with an electroactive polymer would be desirable.

SUMMARY OF THE INVENTION

The present invention overcomes the limits and deficiencies of the prior art by providing systems and methods for electrically communicating with an electroactive polymer using one or more electrodes that do not contact the polymer. A non-contact electrode communicates charge to or from a portion of the polymer, typically through a medium. For example, the medium may include air, a vacuum, or a specialized gas that facilitates transfer of charge between the electrode and the polymer. The charge may include positive or negative ions or electrodes that may be used for actuation, generation, sensing, or to diminish actuation applied to polymer in one or more specific polymer portions.

In one aspect, the present invention relates to a device for converting between electrical energy and mechanical energy. The device comprises an electroactive polymer capable of converting between electrical energy and mechanical energy. The device also comprises at least two electrodes in electrical communication with the electroactive polymer. One of the at least two electrodes is a non-contact electrode, having a portion proximate to the electroactive polymer, that transfers charge to or from a portion of the polymer through a non-condensed medium without contacting the polymer.

In another aspect, the present invention relates to a method for operating an electroactive polymer in electrical communication with at least two electrodes. One of the at least two electrodes is a non-contact electrode, having a portion proximate to the electroactive polymer without contacting the polymer. The method comprises transferring charge between the non-contact electrode and a portion of the polymer through a non-condensed medium to thereby operate the electroactive polymer.

In yet another aspect, the present invention relates to a device for converting between electrical energy and mechanical energy. The device comprises an electroactive polymer capable of converting between electrical energy and mechanical energy. The device also comprises at least two electrodes in electrical communication with the electroactive polymer. One of the at least two electrodes is a non-contact electrode, having a portion proximate to the electroactive polymer, that transfers charge to or from a portion of the polymer through air without contacting the polymer.

These and other features and advantages of the present invention will be described in the following description of the invention and associated figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
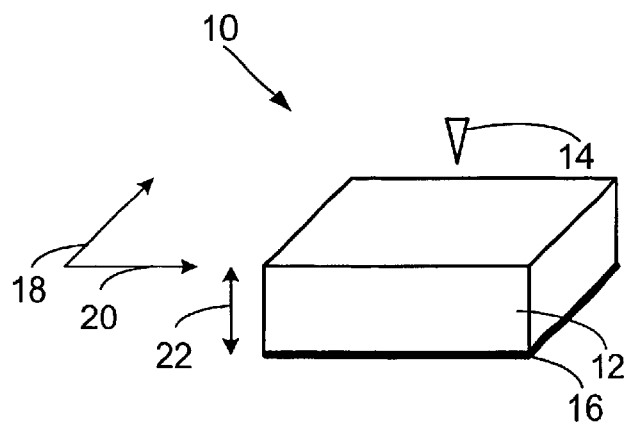
FIGS. 1A and 1B illustrate a top perspective view of a transducer before and after deflection in accordance with one embodiment of the present invention.

Electroactive polymers are capable of converting between mechanical energy and electrical energy. In some cases, an electroactive polymer may change electrical properties (for example, capacitance and resistance) with changing mechanical strain. To help illustrate the performance of an electroactive polymer transducer, FIG. 1A illustrates a top perspective view of a transducer portion 10. Transducer portion 10 comprises electrodes 14 and 16 and an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes. Electrodes 14 and 16 provide or receive a voltage difference and electrical energy across a portion of the polymer 12. Bottom contact electrode 16 is attached to the electroactive polymer 12 on its bottom surface. Top non-contact electrode 14 does not contact polymer 12 and electrically communicates with the top surface of polymer 12.

Figure 1B:
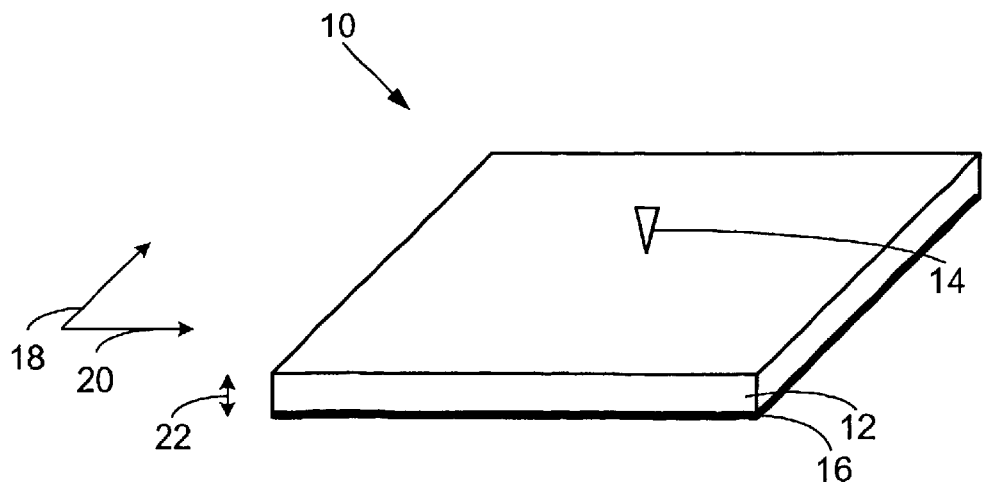

FIGS. 1A and 1B may be used to show one manner in which the transducer portion 10 converts electrical energy to mechanical energy. Polymer 12 may deflect with a change in electric field provided by the top and bottom electrodes 14 and 16. Contact electrode 16 is compliant and changes shape with polymer 12. Deflection of transducer portion 10 in response to a change in electric field provided by the electrodes 14 and 16 is referred to as 'actuation'. For actuation, a change in electric field corresponding to the voltage difference applied to electrodes 14 and 16 produces mechanical pressure within polymer 12. As polymer 12 changes in shape, the deflection may be used to produce mechanical work.

FIG. 1B illustrates a top perspective view of the transducer portion 10 including deflection to an expanded state relative to FIG. 1A. In general, deflection refers to any displacement, expansion, contraction, torsion, linear or area strain, or any other deformation of a portion of the polymer 12. Electroactive polymers in accordance with the present invention are capable of deflection in any direction. In some cases, the electroactive polymer 12 is incompressible, e.g., has a substantially constant volume under stress. In these cases, the polymer 12 decreases in thickness as a result of the expansion in the planar directions 18 and 20. It should be noted that the present invention is not limited to incompressible polymers and deflection of the polymer 12 may not conform to such a simple relationship.

In general, the transducer portion 10 continues to deflect until mechanical forces balance the electrostatic forces driving the deflection. The mechanical forces include elastic restoring forces of the polymer 12 material, the compliance of electrode 16, and any external resistance provided by a device and/or load coupled to the transducer portion 10, etc. The deflection of the transducer portion 10 as a result of the applied voltage may also depend on a number of other factors such as the polymer 12 dielectric constant and the size of polymer 12.

In one embodiment, electroactive polymer 12 is pre-strained. Pre-strain of a polymer may be described, in one or more directions, as the change in dimension in a direction after pre-straining relative to the dimension in that direction before pre-straining. The pre-strain may comprise elastic deformation of polymer 12 and be formed, for example, by stretching the polymer in tension and fixing one or more of the edges while stretched. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. The pre-strain may be imposed at the boundaries using a rigid frame or may also be implemented locally for a portion of the polymer. Generally, after the polymer is pre-strained, it may be fixed to one or more objects. Each object is preferably suitably stiff to maintain the level of pre-strain desired in the polymer. The polymer may be fixed to the one or more objects according to any conventional method known in the art such as a chemical adhesive, an adhesive layer or material, mechanical attachment, etc. In another embodiment, the pre-strain is elastic. After actuation, an elastically pre-strained polymer could, in principle, be unfixed and return to its original state.

Materials suitable for use as an electroactive polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as an electroactive polymer include silicone elastomers such as those provided by Dow Corning of Midland, Mich., acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers of this invention.

Although the discussion so far has focused primarily on one type of electroactive polymer commonly referred to as dielectric elastomers (polymer 12 of FIG. 1A), devices of the present invention may also incorporate other electroactive polymers. As the term is used herein, an electroactive polymer refers to a polymer that responds to electrical stimulation. Other common classes of electroactive polymer suitable for use with some embodiments of the present invention include electrostrictive polymers, and conductive polymers. Electrostrictive polymers are conventionally described as polymers with an intrinsic strain response proportional to the square of the electric field. That is, the electric polarization of the material depends in a non-linear way on the electric field. Conductive polymers are polymers that can conduct electricity. Conductive polymers include electronically conductive polymers as well as ionically conductive polymers. Numerous examples of each type are known in the literature. Similarly, other electroactive polymer materials may be used. These include polymers that exhibit the piezoelectric effect (such as PVDF, ceramic & polymer piezoelectrics, electrostrictive ceramics and various copolymers).

An electroactive polymer of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 100 micrometers.

Suitable actuation voltages for electroactive polymers, or portions thereof, may vary based on the material properties of the electroactive polymer (e.g., dielectric constant) and the dimensions of the polymer (e.g., polymer film thickness). For example, actuation electric fields used to actuate polymer 12 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example. In one embodiment, one of electrodes 14 and 16 is ground.

Transducers and polymers of the present invention are not limited to any particular shape, geometry, or type of deflection. For example, a polymer and electrodes may be formed into any geometry or shape including tubes, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, deflection out of a hole provided on a substrate, etc. Deflection of a transducer may be affected by how the polymer is constrained by a frame or rigid structures attached to the polymer. In one embodiment, a flexible material that is stiffer in elongation than the polymer is attached to one side of a transducer to induce bending when the polymer is actuated.

In some cases, electrodes 14 and 16 operably affect a limited portion of polymer 12 relative to the total area of the polymer. This may be done to prevent electrical breakdown around the edge of polymer 12 or to achieve customized deflections for one or multiple portions of the polymer. As the term is used herein, an active area is defined as a portion of a transducer comprising polymer material 12 operably associated with the electrical energy from at least two electrodes. The term "monolithic" refers to electroactive polymers, transducers, and devices comprising a plurality of active areas on a single electroactive polymer.

Figure 1C:
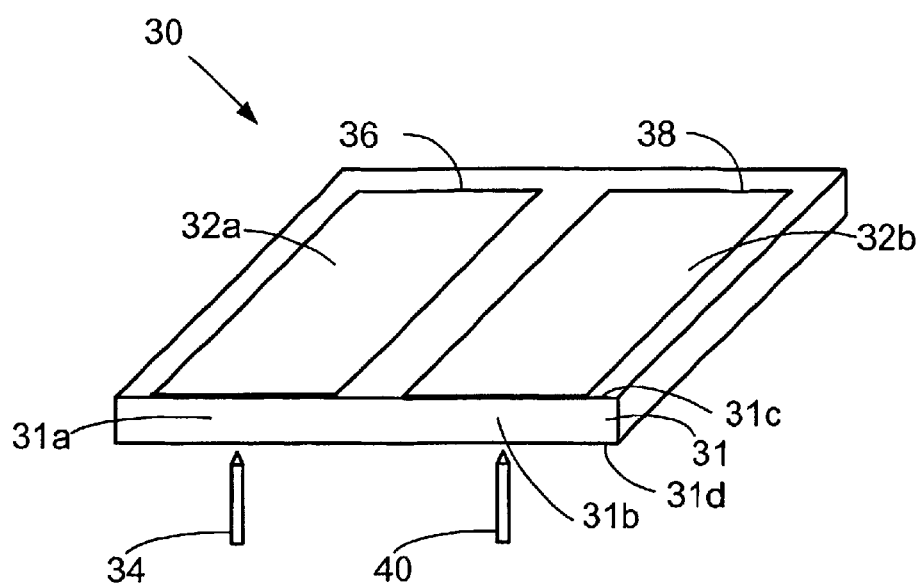
FIG. 1C illustrates a monolithic transducer comprising a plurality of active areas in accordance with another embodiment of the present invention.

FIG. 1C illustrates a monolithic transducer 30 comprising a plurality of active areas in accordance with one embodiment of the present invention. Monolithic transducer 30 comprises an electroactive polymer 31 including two active areas 32a and 32b. The polymer may be held using, for example, a rigid frame (not shown) attached at the edges of the polymer 31.

The active area 32a is controlled by bottom and top electrodes 34 and 36. Top contact electrode 36 is complaint and attaches to polymer 31 on its top surface 31c. Bottom non-contact electrode 34 is disposed below and proximate to the bottom surface 31d of polymer 31, and transmits charge to or from a bottom surface of portion 31a of polymer 31 without contacting polymer 31. Electrodes 34 and 36 provide a voltage difference across portion 31a, which deflects with a suitable change in electric energy provided by electrodes 34 and 36. The portion 31a comprises any portions of the polymer 31 having sufficient electrostatic force to enable deflection upon application of an actuating voltage using electrodes 34 and 36.

The active area 32b is controlled by top and bottom electrodes 38 and 40. Top contact electrode 38 is complaint and attaches to polymer 31 on its top surface 31c. Bottom non-contact electrode 40 is disposed below and proximate to the bottom surface 31d of polymer 31, and transmits charge to or from a bottom surface of portion 31b without contacting polymer 31. The electrodes 38 and 40 provide a voltage difference across a portion 31b, which deflects with a suitable change in electric energy provided by electrodes 38 and 40. The portion 31b comprises any portions of polymer 31 having sufficient electrostatic force to enable deflection upon application of an actuating voltage using electrodes 38 and 40.

Active areas for monolithic polymers and transducers of the present invention may be flexibly arranged. In one embodiment, active areas in a polymer are arranged such that elasticity of the active areas is balanced. In another embodiment, a transducer of the present invention includes a plurality of symmetrically arranged active areas. Further description of monolithic transducers suitable for use with the present invention are further described in commonly owned U.S. patent application Ser. No. 09/779,203, which is incorporated by reference herein for all purposes.

Having briefly discussed general aspects of electroactive polymer transducers and electroactive polymers suitable for use with the present invention, non-contact and contact electrodes for electrically communicating with an electroactive polymer will now be expanded upon.

Figure 2A:
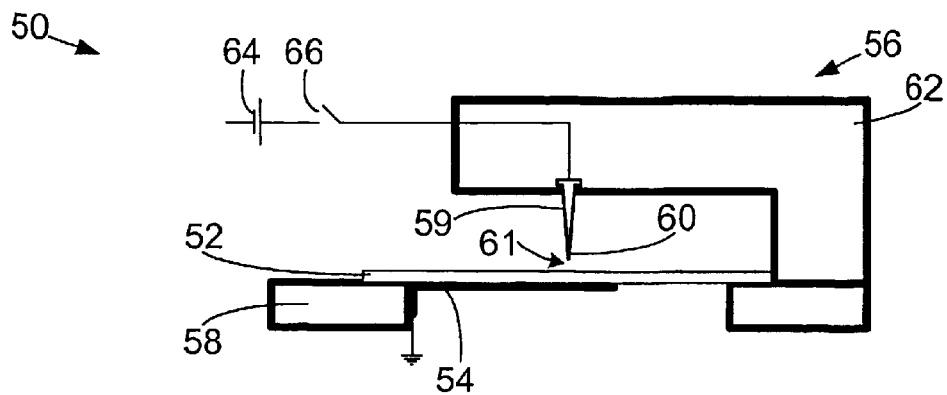
FIG. 2A illustrates a simplified cross sectional side view of an electroactive polymer device including a non-contact electrode in accordance with one embodiment of the present invention.
Figure 2B:
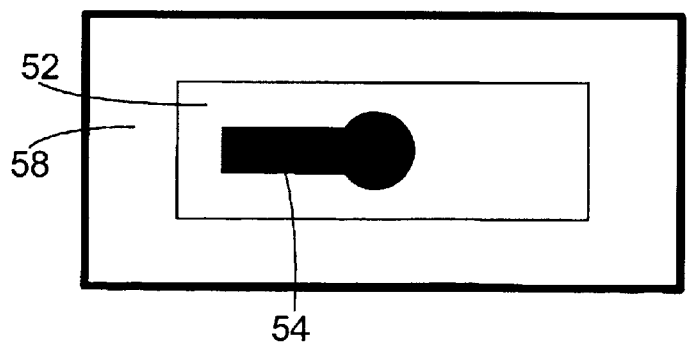
FIG. 2B illustrates a simplified top view of the electroactive polymer, frame and contact electrode from FIG. 2A.
Figure 2C:
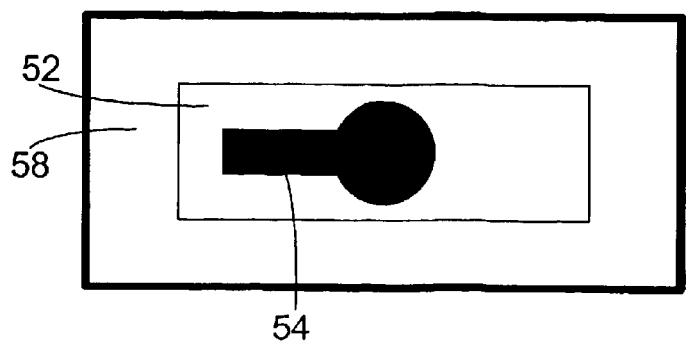
FIG. 2C illustrates a simplified top view of the polymer of FIG. 2A after actuation.

FIGS. 2A–2C illustrates simplified views of an electroactive polymer device 50 including a non-contact electrode in accordance with one embodiment of the present invention. Device 50 comprises electroactive polymer 52, bottom contact electrode 54, top non-contact electrode 56, and frame 58. Non-contact electrode 56 comprises a metal pin 59 and support 62. A, voltage source 64 and switch 66 are also implemented to electrically operate non-contact electrode 56.

Polymer 52 comprises an acrylic film stretched and attached to frame 58 using a suitable adhesive. Electrodes 54 and 56 apply a voltage difference to polymer 52. The voltage may be either constant or varying over time. Bottom contact electrode 54 comprises a carbon grease adhered to polymer 52 that deflects with polymer 52 deflection. Bottom electrode 54 is ground.

Top non-contact electrode 56 is in electrical communication with polymer 52 and transfers charge to or from a portion of polymer 52 through a medium without contacting the polymer. In one embodiment, non-contact electrode 56 comprises any suitable charge source for transferring charge from the charge source to polymer 52 or to a conductor having a portion proximate to polymer 52 (e.g., pins 112 of FIG. 5). In another embodiment, the charge source is a field emitter that transmits charge from the emitter towards the polymer using an electric field. For example, the charge source may comprise a simple metal pin, pin array or more sophisticated mechanism. In a specific embodiment, the charge source is microfabricated. For example, a Spindt cathode may be suitable to produce and transmit charge to polymer 52 in applications where a relatively low voltage is desirable. Alternately, non-contact electrode 56 may include a charge source that generates ions from a side position not orthogonally facing a surface of polymer 52, and relies on the charge to be blown or otherwise directed to a surface portion of polymer 52. Scanning technology that allows position and shape control of the charge distribution on specific portions of a polymer may also be implemented with the charge source. In one embodiment, the charge source employs a vacuum electron approach such as a cathode ray tube to produce charge. In another embodiment, the charge source comprises a light based ion or electron generation source such as a photoconductor, photomultiplier tubes, a photoemissive material to produce charge. In some cases, voltage multiplication may be used to raise electrical energy of charge produce from the charge source.

As shown in FIG. 2A, non-contact electrode 56 comprises a metal pin 59 having a distal tip 60 disposed relatively close to polymer 52. The metal pin generates ions above polymer 52, which propagate through air 61 to charge and actuate polymer 52. In one embodiment, distal tip 60 is sharpened or otherwise decreased in surface area in the plane perpendicular to the direction of transfer of charge between non-contact electrode 56 and polymer 52. Sharpened tips increase the local electric field and more easily generate ions. Non-contact electrode 56 also comprises support 62 to hold and position tip 60 relative to polymer 52. Voltage source 64 supplies voltage to metal pin 59 and the voltage difference between electrodes 54 and 56. Voltage source 64 may be turned on/off using switch 66. More specifically, when switch 66 is closed, an active area of polymer 52 underneath pin 59 actuates and expands in planar area. Conversely, when switch 66 is opened, the active area contracts to its resting position. In another embodiment where electrode 56 receives charge from polymer 52, voltage source 64 can either sink or source charge (e.g., using a capacitor or other techniques known to one of skill in the art; voltage source 64 can also vary its voltage relative to the voltage of electrode 54 to drive charge and current in a desired direction) as opposed to only sourcing the charge. FIG. 2B illustrates a simplified top view of polymer 52 before actuation (non-contact electrode 56 is not shown in the top view for purposes of illustration). FIG. 2C illustrates a simplified top view of polymer 52 after actuation including planar expansion of an area of the polymer proximate to tip 60.

The size of the portion of polymer 52 below and proximate to tip 60 that is actuated depends on the voltage difference applied between electrodes 54 and 56 and a number of other factors such as the thickness and dielectric constant of polymer 52, the gap between tip 60 and polymer 52, and the conductivity of the upper surface of the polymer 52. However, one may deliberately actuate a smaller portion of polymer 52—even though bottom electrode 54 is relatively large—by controlling the voltage applied by electrode 56. In any particular embodiment, the exact actuating voltage corresponding to a particular deflection may depend on a number of factors such as the polymer dielectric constant, medium dielectric constant, polymer 52 size, polymer 52 thickness, and humidity.

In some cases, the top surface of the polymer 12 may be considered an electrode in that it has some conductivity which is at least marginally greater than the surrounding medium. As a result, charge may spread out from a received charge emission to form an actuation area. In one embodiment, a conductive or slightly conductive coating may be disposed on the polymer surface to control the shape of the active area. For example, a light dusting of graphite powder may be applied to the surface of a silicone polymer for this purpose. In general the higher the conductivity of the coating, the more charge will spread. In a specific embodiment where a material or coating of known conductivity is applied to a surface of the polymer to control the conductivity thereof, the material may be chosen to control the effects of humidity introduced by the medium.

In one embodiment, the distance between tip 60 and the closest portion of electroactive polymer 52 being actuated is less than about 5 centimeters. In a specific embodiment, the distance between tip 60 and the closest portion of polymer 52 is between about 0.5 millimeters and about 5 millimeters. As one of skill in the art will appreciate, the distance between the non-contact electrode and the polymer will vary with a number of factors such as the medium between the two, polymer 52 and its material properties, polymer 52 thickness and actuation voltages used, etc.

Charge transferred between non-contact electrode 56 and polymer 52 may comprise positive or negative charge such as positive or negative ions, electrons, charged particles, or any other suitable charge capable of affecting the electrical state of polymer 52. The charge may further be controlled using any of the various techniques known for controlling the flow of charge through non-condensed medium, including liquids and vacuum. For example, in vacuum, it is well known that magnetic fields can be used to control the flow of charge through space. Externally applied electrostatic fields can similarly influence the flow of charge, and in air or gas one can also selectively blow ions in different directions to control their flow. For a liquid, charge-carrying particles may be introduced into the liquid to promote similar effects.

The charge is typically transferred between the non-contact electrode and the polymer through a non-condensed medium. The non-condensed medium may comprise any gaseous or insulating liquid medium (or combination thereof), any supercritical fluid, or plasma. In one embodiment, the non-condensed medium is non-conducting. For example, the gas may include air or an inert gas. An inert gas may be useful to preserve the longevity of a metal tip used as a charge emitter. The medium may also include a pre-ionization that facilitates ion generation and ion transmission, e.g., in a gas or plasma. Alternately, the medium may be a vacuum, as described below. An insulating liquid contained between the polymer and charge source may also be suitable in some applications. The definition of "insulating" with regards to a non-condensed medium used in a non-contact electrode is taken to mean nominally insulating. For example, air or vacuum is considered nominally insulating, though under the proper circumstances a sufficient amount of charge can be conducted through these medium to actuate the electroactive polymer. Non-condensing medium may have, for example, resistivities greater than 100,000 ohm-cm and, more particularly, greater than 1 megohm-cm when measured at low field strengths.

After removal of an actuation voltage from non-contact electrode 56, polymer 52 typically elastically contracts to its initial resting position. Generally, electroactive polymers with higher surface resistivities and lower leakage will contract more slowly when a voltage is removed. To decrease contraction time, non-contact electrode 56 may generate and transmit a suitable amount of oppositely charged ions than those used to actuate the polymer, thereby expediting the removal of charge and polymer elastic return. Opposite charge ions can be generated by changing the voltage applied to the tip 60. For example, if tip 60 is originally switched to positive voltage (relative to ground and electrode 54) to actuate and expand the polymer 52, then to contract or de-actuate polymer 52 more quickly (compared to simply opening the voltage switch 66) one can ground or apply a small negative voltage (relative to ground and electrode 54) to tip 60. The small negative voltage should be significantly less than that required to actuate the film with electrode 54 held at ground—otherwise the negative voltage itself will simply cancel the charge deposited with the positive voltage and proceed to re-actuate the film with a negative voltage.

Figure 3:
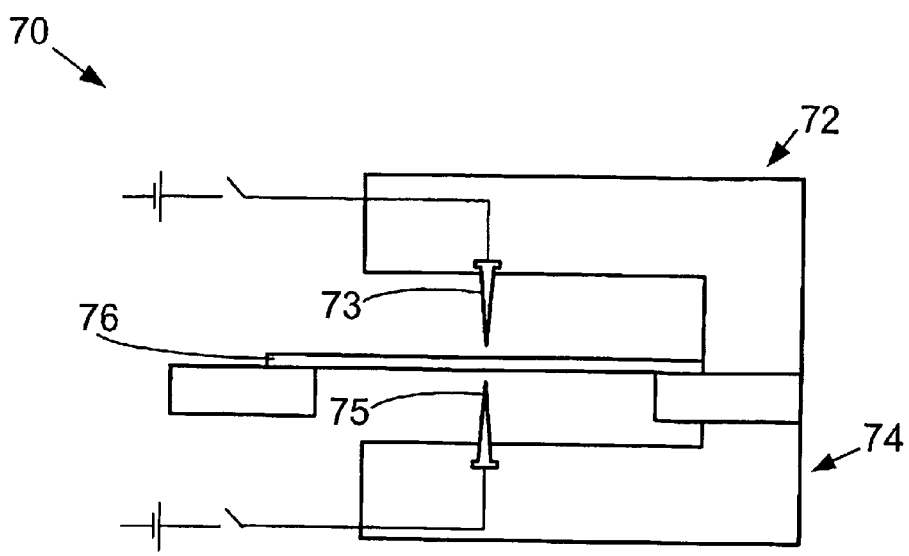
FIG. 3 illustrates an exemplary arrangement for an electroactive polymer device comprising two non-contact electrodes disposed on opposing sides of polymer in accordance with one embodiment of the present invention.

Although devices of the present invention have been discussed with respect to one non-contact electrode and one contact electrode used on opposing sides of a polymer, it is also possible to use multiple non-contact electrodes. FIG. 3 illustrates an exemplary arrangement 70 for an electroactive polymer device comprising two non-contact electrodes 72 and 74 disposed on opposing sides of polymer 76 in accordance with one embodiment of the present invention.

Figure 4A:
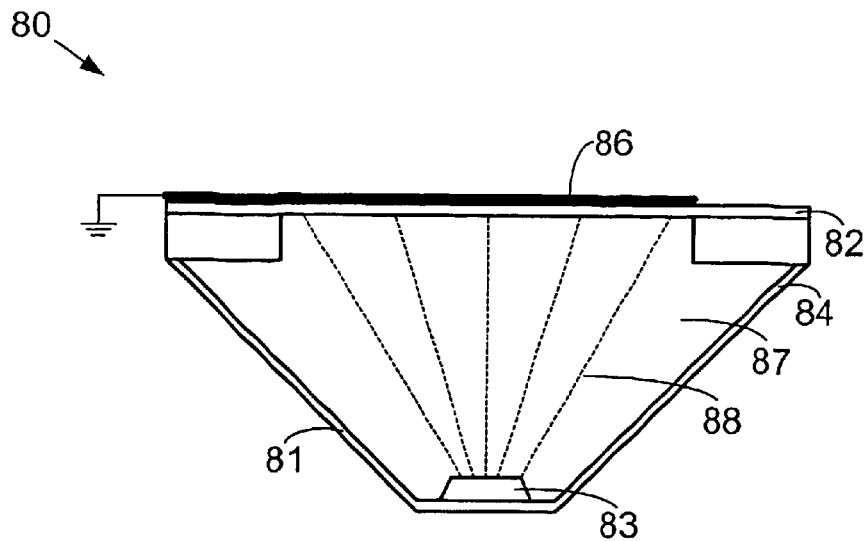
FIG. 4A illustrates an electroactive polymer device employing a cathode ray tube in accordance with one embodiment of the present invention.

Non-contact electrode 72 comprises a sharp tipped metal 73 that emits ions and transfers them through air to polymer 76. Non-contact electrode 74 comprises a second sharp tipped metal 75 that emits ions and transfers them through air to the opposite surface of polymer 76. Either non-contact electrode 72 and 74 may act as an anode with the other being a cathode. FIG. 4A illustrates an electroactive polymer device 80 employing a cathode ray tube 81 in accordance with one embodiment of the present invention. Cathode ray tube (CRT) 81 comprises an electron emitter 83 that projects a high voltage electron stream 88 towards one or more portions of an electroactive polymer 82 through a vacuum 87 maintained inside tube 84. Polymer 82 supports the vacuum pressure within tube 84, but in some cases, tube 84 may be continually or periodically pumped to compensate for gas that diffuses through a very thin polymer 82 into vacuum 87.

Electrons in electron stream 88 actuate one or more portions of polymer 82. In one embodiment, emitter 83 includes a film that, when heated, emits electrons into vacuum 87 and directly onto polymer 82. Contact electrode 86 is coupled to the surface of polymer 82 opposite vacuum 87 and acts as an anode for device 80. Thus, polymer 82 attracts electrons pouring from emitter 83. An advantage of device 80 is that electron stream 88 may be precisely controlled using conventional cathode ray tube technology, e.g. such as CRT display technology. For example, the electron stream 88 may be focused using a focusing anode into a tight beam and accelerated by an accelerating anode. This tight, high-speed beam of electrons transmits through vacuum 87 and actuates one or more portions of polymer 82 at the other end of tube 84. In addition, steering coils may be used to direct and steer electron stream 88 to a particular portion of polymer 82. The steering coils may comprise copper windings that are able to create magnetic fields inside tube 84, which electron stream 88 responds to. For example, one set of coils may create and magnetic field that controls vertical position of electron stream 88, while another set of coils moves electron stream 88 horizontally. By controlling voltages in the steering coils, a user may position electron stream 88 at any point on polymer 82 for deflection of a particular portion. Thus, a non-contact electrode of the present invention may be configured to transfer electrons to specific portions of an electroactive polymer and define one or more active areas according to the directed transfer.

The electron stream 88 can be selectively controlled to actuate different portions of the polymer 82 just as a conventional CRT can selectively cause light emission in an ordinary CRT display with phosphors. For the highest resolution, the electron stream 88 would be scanned quickly enough so that it would only lower the voltage of the vacuum side of polymer 82 by a small amount relative to the (negative) potential of the electron stream. For example, if the electron stream had a negative potential at the emitter 83 of −10000 V, the beam might be scanned so that the potential of the vacuum side of the actuated regions of polymer 82 doesn't go below −500 to −1000 V. If the electron stream 88 is scanned too slowly relative to the current flow and the vacuum side of polymer 82 goes too low in voltage, then the actuated regions will themselves start to electrostatically influence the beam and resolution may degrade. In many cases, the time for contracting or de-actuation of the different regions of polymer 82 depend on its leakage resistance. A higher leakage resistance will use require less beam power to maintain actuation, but a lower leakage resistance can de-actuate and change the pattern of actuation on polymer 82 more quickly.

Figure 4B:
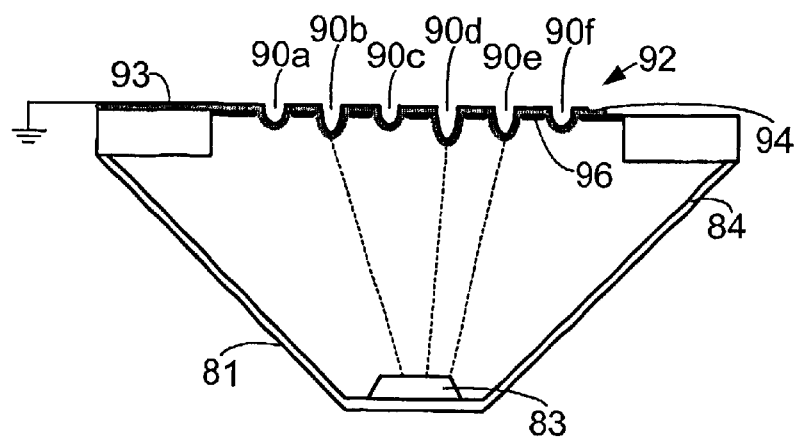
FIG. 4B illustrates an array of diaphragms included in a monolithic transducer that are selectively actuated using the non-contact electrode arrangement of FIG. 4A in accordance with another embodiment of the present invention.

FIG. 4B illustrates an array of diaphragms 90 included in a monolithic transducer 92 that are selectively actuated using the non-contact electrode arrangement of FIG. 4A in accordance with another embodiment of the present invention. As shown, transducer 92 comprises an electroactive polymer 94 attached to a rigid plate 96, which supports polymer 94 and includes a series of apertures that allow deflection of polymer 94 portions perpendicular to the area of the apertures; thus defining six diaphragms 90*a–f*. In addition to defining the diaphragms 90*a–f*, rigid plate 96 also helps support the vacuum. Transducer 92 also comprises a compliant electrode 93 attached to the non-vacuum surface of polymer 94. In a specific embodiment, transducer 92 comprises a 60 micron acrylic or silicone based polymer 94 having 2–20 diaphragms 90 with a diameter of about 0.5 to about 2 millimeters each.

Each diaphragm portion 90 is capable of independent deflection away from the plane of rigid frame 96. For example, upon application of a suitable voltage between electrodes 83 and 93, portion 90*b* expands away from the plane of the frame 96, as illustrated in FIG. 4B. The vacuum pressure in tube 84 creates a slight bias pressure on polymer 94 that draws the polymer of diaphragms 90 slightly inward toward emitter 83, as illustrated by non-actuated diaphragms 90*a*, 90*c*, and 90*f* in FIG. 4B. The electron stream produced by emitter 83 may be manipulated as described above to selectively deflect one or multiple diaphragms 90. As shown, diaphragm 90*d* has a slightly larger deflection than diaphragms 90*b* and 90*e*. Thus, multiple diaphragms 90 may be independently charged by electrons produced from emitter 83, and actuate and extend further inward toward emitter 83, as illustrated in FIG. 4B.

In applications where it is not necessary to make direct physical contact with the upper surface of polymer 82, a separate vacuum plenum that encompasses that upper surface may be employed. In this way, the net pressure difference across the polymer 82 may be controlled. Typically, this additional plenum would be at a pressure slightly greater than the vacuum 87 so that the net bias pressure on the polymer is reduced compared to the case with no second plenum.

One advantage of the device shown in FIG. 4B is that a large number of diaphragms, e.g., a thousand or more, may be individually addressed and actuated in a controlled manner without a high degree of switching complexity. This in contrast to conventional contact electrodes which might need independent wiring for each active area's set of electrodes. Thus, given suitable electric field control with magnetic coils and the like, or alternate charge emission control techniques such as specialized emitters and accelerators, a large number of active areas on a monolithic transducer may be independently and selectively actuated and controlled. Given that active areas on an electroactive polymer may be customized and precisely patterned using, for example photolithographic techniques at very low resolutions, the present invention allows for advanced techniques to achieve customize deflection for portions of an electroactive polymer—even at microscopic levels. In addition, the independence from individual wiring for each active area simplifies manufacturing complexity of many monolithic transducers.

In one embodiment, conventional electric field emission and control technology that permits spatial and temporal control of electron incidence on a surface is used to selectively actuate one or more specific portions of an electroactive polymer. The portions may be actuated simultaneously or disparately over a time period. For example, conventional cathode ray tube technology also found in modern televisions may be used to direct the flow electrons to particular portions of a polymer, and turn off/off different portions over time. The electric field emission and control technology may employ vector and raster scanning to selectively actuate specific portions of a polymer. Selective actuation of devices comprising numerous diaphragms 90 as shown in FIG. 4B may be useful in applications such as refreshable Braille displays, full-page inkjet printers, or other applications where spatially and temporally selective actuation of separate active areas is desirable.

Charge emitted from a non-contact electrode may also be used to locally discharge, rather than charge, an electroactive polymer. For example, referring to the apparatus of FIG. 4B, a second contact electrode may be attached to the surface of polymer 82 facing emitter 83, and used to transmit positive charge to polymer 82 for actuation. The contact electrode may comprise a set of high conductivity regions or wires that are used to transmit positive charge rapidly to low conductivity regions in contact with polymer 82. When the negatively charged electron stream 88 hits the low conductivity regions, it cancels the existing positive charge faster than it can be replaced by the high conductivity wires transmitting charge through the low conductivity regions. Thus, polymer 82 may be locally discharged (it contracts) wherever it is hit by electron stream 88. This reverse mode of non-contact electrode operation is useful, for example, to make an actuated diaphragm such as that described with respect to FIG. 4B, contract quickly to eject a drop of ink.

In another method of non-contact electrode use, charge is communicated between a non-contact electrode and a polymer to achieve electrostatic functionality. In this case, the position of a portion of the polymer is maintained for a duration. Subsequently, charge may be removed, and actuation ceases or diminishes as desired. This type of extended duration actuation may be useful in applications such as relief maps where it is desirable to maintain the position of a polymer, or portions thereof, for an extended period.

Figure 5:
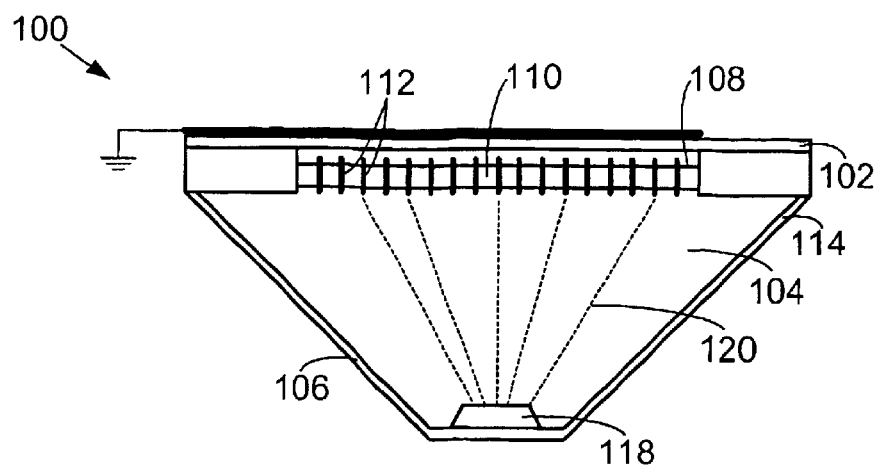
FIG. 5 illustrates an alternate approach to transmitting electrons from an emission source to an electroactive polymer in accordance with another embodiment of the present invention.

FIG. 5 illustrates an alternate approach to transmitting electrons from an emission source to an electroactive polymer in accordance with another embodiment of the present invention. Device 100 comprises an electroactive polymer 102 separated from a vacuum 104 of cathode ray tube 106 using a seal 108, which provides air tight containment for vacuum 104. Seal 108 comprises a rigid plate 110 and an array of conductive pins 112 that traverse the thickness of rigid plate 110 and protrude slightly from either side. In one embodiment, pins 112 are metal and embedded in rigid plate 110, which comprises glass or another suitable non-conductive solid material.

Conductive pins 112 collect charge emitted from charge source 118, conduct charge through plate 110, transfer the charge into a medium between seal 108 and polymer 102—without compromising the vacuum in tube 114, and onto portions of polymer 102. In this case, conductive pins 112 transfer charge onto local regions of polymer 102 as defined by the spacing and cross-section of the pins 112. In one embodiment, the tips of pins 112 proximate to polymer 102 are sharpened to decrease the cross-sectional area and improve charge transfer from pins 112 to polymer 102. A distance between the tip of pins 112 proximate to polymer 102 and polymer 102 less than about 1 cm a suitable for many applications. Smaller distances in the range of about 0.5 mm to about 5 mm may also suitable for some applications.

In operation, emitter 118 produces an electron stream 120 whose electrons are collected and conducted through plate 110 via conducting pins 112. Situated between seal 108 and polymer 102 are ions in a gaseous medium, created by the high electric fields at the tips of energized pins 112, that transmit the charge received by conducting pins 112 to polymer 102. Electron stream 120 may be directed at all pins 112 in the array or a subset of pins 112 associated with a customize deflection of polymer 102. Although the array of conducting pins 112 is illustrated and equally spaced and distributed array of conductors, it is understood that the conducting pins 112 may have customized spacing and sizes to influence a corresponding customized deflection on polymer 102. For example, if it were desired to actuate a star-shaped region, the array of pins could form the shape of a star. The denser the array and lower conductivity of the non-contacted surface of the polymer, the greater the resolution of the shape that is possible. In one embodiment of non-contact electrical communication, charge generation is separated from high-voltage drive. In this case, a relatively low voltage source may be used as a charge source to produce ions with an appropriate high voltage bias relative to an opposite electrode. Since an electroactive polymer may operate at an actuation voltage of thousands of volts, a bias voltage may be used to produce a large voltage difference across the polymer using ions or other charge generated at relatively low voltage. For example, the charge source may produce charge at about 10 volts to about 500 volts, which is subsequently used with a bias source to apply a voltage of thousands of volts across the polymer. An advantage of this design is that the charge source may be switched and implemented using relatively low voltage switches.

Figure 6A:
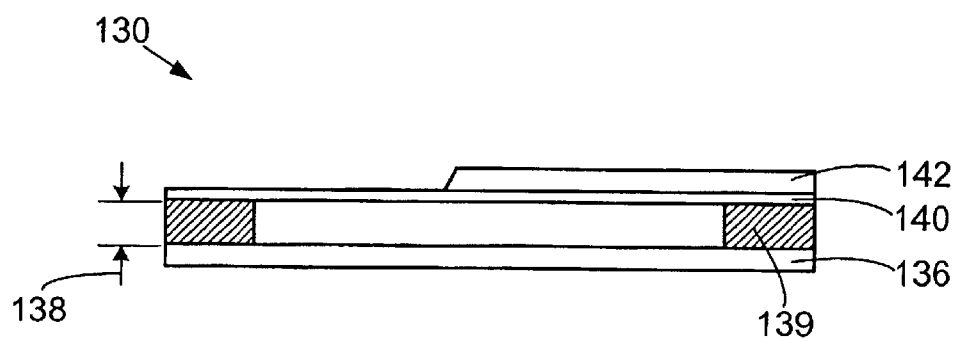
FIGS. 6A and 6B illustrate an exemplary device comprising a base conductor assembly that separates charge production from voltage step-up in accordance with one embodiment of the present invention.
Figure 6B:
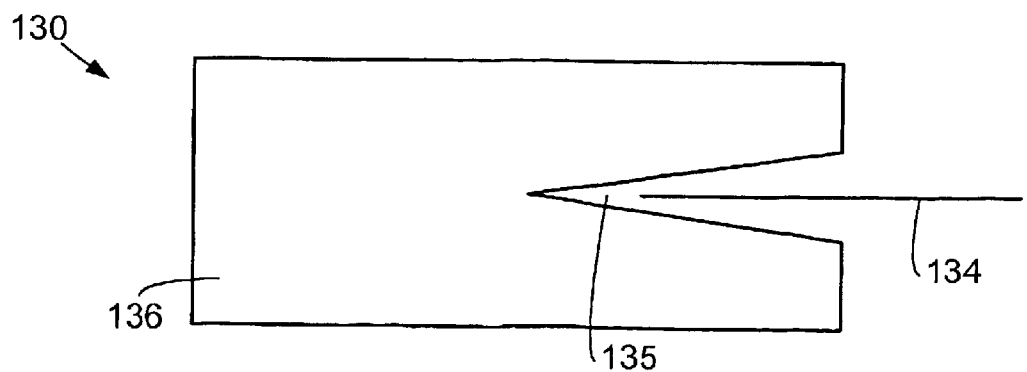

FIGS. 6A and 6B illustrate an exemplary device 130 comprising a base conductor assembly that separates charge production from voltage step-up in accordance with one embodiment of the present invention. As shown in FIG. 6B, base conductor assembly comprises a wire 134 that extends into an inlet 135 of base conductor 136. Referring to FIG. 6A, base conductor 136 is disposed below polymer 140 with a spacing 138 in the range of about 1 mm to about 5 mm using spacers 139. Water 142 is disposed above polymer 140 and acts as a transparent contact electrode. Other electrode materials, such as carbon grease or compliant conductive polymers or polymer-particle composites, may be used instead of water. In a specific embodiment, wire 134 is a 1 mil copper wire and base conductor 136 comprises brass.

In one method of device 130 operation, switching is performed at the high-voltage side. In this case, water electrode 142 operates as ground, base conductor 136 operates at a high bias voltage that is insufficient to actuate polymer 140 by itself, and wire 134 provides the necessary voltage to actuate polymer 140. Switching and controlled actuation of polymer 140 may then be performed using wire 134. In a specific embodiment, polymer 140 is an acrylic film having a thickness of about 0.5 mm and pre-strained by about 300 percent in each direction, spacing 138 is about 3 mm, base conductor 136 operates at about 4500 volts, and wire 134 may provide about 1000 volts. Thus, by switching on a voltage difference between wire 134 and nearby base conductor 136—less than that necessary to actuate polymer 140 alone—polymer 140 may be controllably actuated. In this case, the voltage provided by wire 134 is enough to locally create ions which migrate to, and actuate, polymer 140. Wire 134 creates positive ions using only a 1000 V difference between it and base conductor 136, but some of the positive ions so created can migrate up to polymer 140. Since the positive ions were created at 4500–5500 V (depending on the energy loss needed for ion creation and migration), when they migrate to polymer 140 they can apply a large voltage difference between the bare, bottom side of polymer 140 and the upper, electroded side held at ground potential. In another method of device 130 operation, switching is performed at ground. In this case, −4.5 kV is applied on water electrode 142, ground is at base conductor 136, and wire 134 is switched above ground.

An advantage of device 130 is that it separates charge production from high voltage drive. This allows device 130 to employ low voltage switches and ion production on wire 134 apart from high-voltage step up needed for some electroactive polymers. To reduce the voltage relative to the values described in the exemplary embodiment, one may dispose wire 134 closer to base conductor 136, use a sharper point on wire 134, use a thinner polymer 140, or use an array of tips instead of a single wire. In some cases, ions may be produced as low as about 300 volts—the typical minimum breakdown voltage of air. In other cases, even lower voltages may be used with special structures such as microfabricated ultra-sharp tips (sometimes referred to as Spindt or cold cathodes).

In another embodiment, the charge source employs a photoconductor, photomultiplier tubes, or a photoemissive material that produces electrons in response to photon excitation, and voltage step up is accomplished via an electric field. In this case, switching and control for an array of active areas may be performed using light switching techniques. The light is then converted to electrons using the photoelectric charge source, and the electric field is used to increase electrical energy of charge produced by the source. In this case, the light is being used to create electrons directly.

Figure 6C:
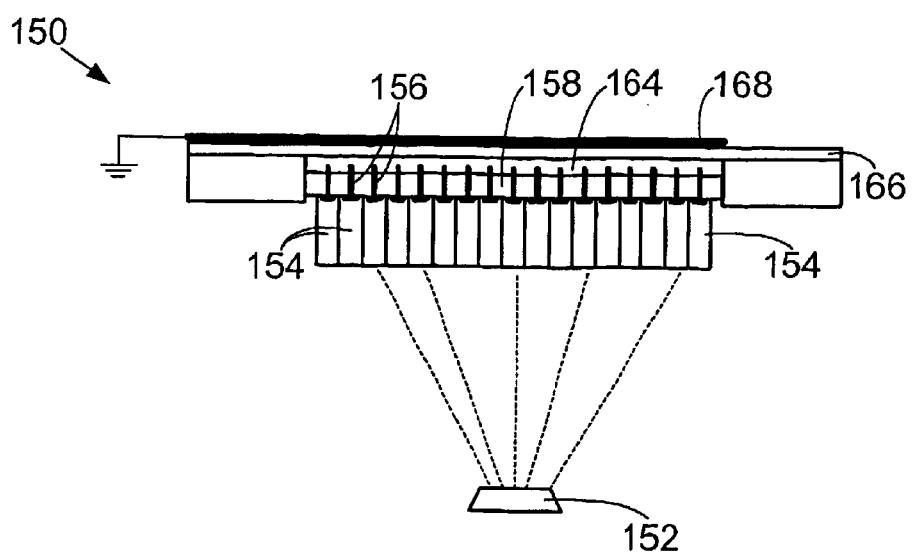
FIG. 6C illustrates a device comprising photomultiplier tubes as an electron source in accordance with another embodiment of the present invention.

FIG. 6C illustrates a device 150 comprising photomultiplier tubes in accordance with another embodiment of the present invention. Photon source 152 emits light that is received by photomultiplier tubes 154. Photomultiplier tubes 154 receive light from photon source 152 and emit electrons, which are received by pins 156. Pins 156 conduct electrons through rigid plate 158, which holds pins 156 and seals a vacuum within tubes 154. Charge emitted by pins 156 transmits through medium 164 onto polymer 166. Attached to the opposing surface of polymer 166 is compliant contact electrode 168. An advantage of device 150 is that selective actuation of portions of polymer 166 may occur using photo switching techniques in photon source 152. In this case, the charge source, namely, photomultiplier tubes 154, emit electrons that are used to actuate polymer 166. Photomultiplier tubes may be conventional, discrete photomultiplier tubes, conventional discrete photo cathodes, or they may be similar to micro channel image intensifiers but have a metal pin instead of phosphor to receive the electron cascade. Electrode 168 can be biased above ground as needed to increase the potential difference across the polymer.

Having discussed several non-contact electrodes suitable for use with the present invention, various compliant contact electrodes will now be discussed. Generally, contact electrodes suitable for use with the present invention may be of any shape and material provided that they are able to supply or receive a suitable voltage to or from an electroactive polymer. As electroactive polymers of the present invention may deflect at high strains, electrodes attached to the polymers should also deflect without compromising mechanical or electrical performance. Correspondingly, the present invention may include compliant electrodes that conform to the changing shape of an electroactive polymer to which they are attached. The electrodes may be only applied to a portion of an electroactive polymer and define an active area according to their geometry.

In one embodiment, compliant electrodes of the present invention comprise a conductive grease such as carbon grease or silver grease. The conductive grease provides compliance in multiple directions. Particles may be added to increase conductivity. By way of example, carbon particles may be combined with a polymer binder such as silicone to produce a carbon grease that has low elasticity and high conductivity. Other materials may be blended into the conductive grease to alter one or more material properties.

Compliant electrodes of the present invention may also include those made from colloidal suspensions. Colloidal suspensions contain submicrometer sized particles, such as graphite, silver and gold, in a liquid vehicle. Generally speaking, any colloidal suspension having sufficient loading of conductive particles may be used as an electrode. In a specific embodiment, a conductive grease including colloidal sized conductive particles is mixed with a conductive silicone including colloidal sized conductive particles in a silicone binder to produce a colloidal suspension that cures to form a conductive semi-solid. To facilitate adhesion between the polymer and an electrode, a binder may be added to the electrode. By way of example, a water-based latex rubber or silicone may be added as a binder to a colloidal suspension including graphite.

Compliant electrodes may also be achieved using a high aspect ratio conductive material such as carbon fibrils or carbon nanotubes. In another embodiment, mixtures of ionically conductive materials may be used for the compliant electrodes. This may include, for example, water based polymer materials such as glycerol or salt in gelatin, iodine-doped natural rubbers and water-based emulsions to which organic salts such as potassium iodide are added. Various other types of electrodes suitable for use with the present invention are described in copending U.S. patent application Ser. No. 09/619,848, which is previously incorporated by reference for all purposes. Electrodes described therein that are suitable for use with devices of the present invention include structured electrodes comprising metal traces and charge distribution layers and textured electrodes comprising varying out of plane dimensions.

Materials used for contact electrodes of the present invention may vary. Suitable materials used in an electrode may include graphite, carbon black, colloidal suspensions, thin metals including silver and gold, silver filled and carbon filled gels and polymers, and ionically or electrically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

While the present invention has primarily been discussed herein with respect to transferring charge from a non-contact electrode to a polymer (or conducting pins proximate to the polymer), it is understood that, in many cases, transfer of charge between a non-contact electrode and electroactive polymer is bidirectional. That is, charge may flow from the polymer to the non-contact electrode for many of the designs described above. In one embodiment, the non-contact electrode is set to ground. In this case, charge may be supplied to a polymer using a contact electrode on the opposing surface of the polymer. Charge then communicates from the contacting electrode, through the polymer, and through a medium to the non-contact electrode.

For ease of understanding, the present invention has mainly been described and shown by focusing on a single form of electroactive polymer operation—when the transducer is operating as an actuator. However, electroactive polymer transducers have other functional uses—such as sensing and generation. In these cases, charge may be transferred both to and from the polymer.

FIGS. 1A and 1B may be used to show one manner in which the transducer portion 10 converts mechanical energy to electrical energy. For example, if the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Stretching the transducer refers to deflecting the transducer from its original resting position—typically to result in a larger net area between the electrodes, e.g. in the plane defined by directions 18 and 20 between the electrodes. The resting position refers to the position of the transducer portion 10 having no external electrical or mechanical input and may comprise any pre-strain in the polymer. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area in the plane defined by directions 18 and 20 (orthogonal to the thickness between electrodes). When polymer 12 becomes thicker, it separates the surface proximate to electrode 14 and electrode 16 and their corresponding unlike charges, thus raising the electrical energy and voltage of the charge. Further, when the surface proximate to electrode 14 and electrode 16 contract to a smaller area, like charges compress, also raising the electrical energy and voltage of the charge. Thus, with different charges between electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting as a generator.

Thus, some devices of the present invention may also be configured or designed for use as a generator to produce electrical energy. Typically, a generator of the present invention comprises a polymer arranged in a manner that causes a change in electric field in response to deflection of a portion of the polymer. The change in electric field, along with changes in the polymer dimension in the direction of the field, produces an increase in voltage difference, and hence an increase in electrical energy. The increase in electrical energy may be harvested and stored by generation circuitry in electrical communication with the electrodes. The mechanical energy may be harvested from a mechanical source that externally deflects the polymer. Suitable electroactive polymer generator circuits and applications are further described in commonly owned patent application Ser. No. 09/792,877, which is incorporated herein by reference for all purposes.

Electroactive polymers also have a sensing mode. When a relatively small voltage difference is applied between electrodes 14 and 16, deflection of transducer portion 10 will tend to change the voltage difference between the electrodes or to drive charge to or from the electrodes, or do both, depending on the electrical impedance of the interface circuit electrodes 14 and 16 are connected to. Electrical properties of transducer portion 10 will also change with deflection of polymer 12, such as the capacitance of transducer portion 10 and resistance of the polymer and/or electrodes. As polymer 12 changes in size, the changing electrical properties or changing voltage may be detected and used. For example, the change in electric filed in the polymer may be used to drive current to or from one of the electrodes. Sensing electronics in electrical communication with the electrodes may detect the current. Further description of electroactive polymer sensors and suitable electroactive polymer sensing circuits are further described in commonly owned patent application Ser. No. 10/007,705, which is incorporated herein by reference for all purposes.

In one embodiment, devices of the present invention may be applied with multiple electroactive polymer functions. More specifically, transducers of the present invention may be used as an actuator to convert from electrical to mechanical energy, a generator to convert from mechanical to electrical energy, a sensor to detect changes in a parameter, or any combination thereof. Electroactive polymer transducers configured to have more than one function is referred to herein as 'multifunctional'. In all the figures and discussions for the present invention, it is important to note that the polymers and devices may convert between electrical energy and mechanical energy bi-directionally, and charge may be transferred to and from a non-contact electrode accordingly.

For a transducer having a substantially uniform thickness, one method for determining the function of the transducer, or a portion of the transducer associated with a single active area, as being an actuator, sensor, or generator, is to consider the change in net area orthogonal to the thickness associated with the polymer deflection. For these transducers or active areas, when the deflection causes the net area of the transducer/active area to decrease and there is charge on the electrodes, the transducer/active area is converting from mechanical to electrical energy and acting as a generator or sensor. Conversely, when the deflection causes the net area of the transducer/active area to increase and charge is on the electrodes, the transducer/active area is converting electrical to mechanical energy and acting as an actuator or sensor. The change in area in both cases corresponds to an inverse change in film thickness, i.e. the thickness contracts when the planar area expands, and the thickness expands when the planar area contracts. Both the change in area and change in thickness determine the amount of energy that is converted between electrical and mechanical. Since the effects due to a change in area and corresponding change in thickness are complementary, only the change in area is discussed herein for sake of brevity. In addition, although deflection of an electroactive polymer is primarily discussed herein as a net increase in area of the polymer when the polymer is being used in an actuator to produce mechanical energy, it is understood that in some cases (i.e. depending on the loading), the net area may decrease to produce mechanical work. Thus, devices of the present invention may include both actuator, sensing and generator modes, depending on how the polymer is arranged and applied.

As the present invention includes transducers that may be implemented in both the micro and macro scales, and implemented with a wide variety of device designs, the present invention finds use in a broad range of applications. The large numbers of active areas and selective control of each active area permitted by non-contact electrode control of the present invention is well-suited for use with refreshable Braille displays, relief maps, page array inkjets, displays, optical switching systems, dynamic (reconfigurable) molds, adaptive optics, and other applications where selective control of a number of regions is desirable.

Advantageously, a non-contact electrode of the present invention offers a form of electrical communication with a polymer that does not incur surface roughness on the polymer. When numerous active areas are employed by single transducer, non-contact electrodes of the present invention also offer a simpler way to individually address each of the active areas.

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. It is therefore intended that the scope of the invention should be determined with reference to the appended claims.

What is claimed is:

1. A device for converting between electrical energy and mechanical energy, the device comprising:
    an electroactive polymer capable of converting between electrical energy and mechanical energy; and
    at least two electrodes in electrical communication with the electroactive polymer,
    wherein one of the at least two electrodes is a non-contact electrode, having a portion proximate to the electroactive polymer, that transfers charge to or from a portion of the polymer through a non-condensed medium without contacting the polymer and wherein the non-contact electrode comprises a charge source that transmits charge directly to a surface of the polymer.

2. The device of claim 1 wherein the non-condensed medium comprises one of air, a gas, a liquid, an ionized gas, an inert gas and a supercritical fluid.

3. The device of claim 1 wherein the non-condensed medium is a vacuum.

4. The device of claim 3 further comprising a seal between the polymer and the vacuum.

5. The device of claim 1 wherein the charge source generates charge having a voltage between about 10 volts and about 100 volts.

6. The device of claim 1 further comprising a bias voltage source or electric field source that raises a voltage difference of the opposite sides of the polymer to a value greater than that used to generate the charge.

7. The device of claim 1 wherein the charge source comprises a field emitter.

8. The device of claim 7 wherein the charge source comprises a microfabricated field emitter.

9. The device of claim 1 wherein the portion of the non-contact electrode proximate to the electroactive polymer comprises a sharp tipped metal.

10. The device of claim 9 wherein the sharp tipped metal is a Spindt cathode.

11. The device of claim 1 wherein the charge comprises an ion.

12. The device of claim 11 wherein the ion is positive.

13. The device of claim 1 wherein the non-contact electrode receives the charge from the polymer.

14. The device of claim 1 wherein the charge comprises an electron.

15. The device of claim 1 wherein the polymer is a monolithic electroactive polymer.

16. The device of claim 1 further comprising an array of pins that direct the flow of charge between the non-contact electrode and one or more areas on the electroactive polymer.

17. The device of claim 1 wherein the distance between the non-contact electrode and the portion of the electroactive polymer is less than about 5 centimeters.

18. The device of claim 17 wherein the distance between the non-contact electrode and the portion of the electroactive polymer is between about 0.5 millimeters and about 5 millimeters.

19. The device of claim 1 further comprising a high voltage source that provide a voltage greater than 100 volts in electrical communication with the non-contact electrode.

20. The device of claim 1 wherein the electroactive polymer is a dielectric elastomer.

21. The device of claim 1 wherein a second electrode of the at least two electrodes is a compliant electrode attached to the polymer.

22. The device of claim 21 wherein the compliant electrode provides charge to actuate the polymer.

23. The device of claim 21 wherein the polymer is arranged in a manner which causes a portion of the polymer to deflect in response to a change in electric field and/or arranged in a manner which causes a change in electric field in response to deflection of the polymer.

24. The device of claim 1 further comprising a region of high conductivity, operably coupled to the polymer, that receives charge from the non-contact electrode and a region of low conductivity operably coupled to the polymer.

25. A method for operating an electroactive polymer in electrical communication with at least two electrodes, wherein one of the at least two electrodes is a non-contact electrode, having a portion proximate to the electroactive polymer without contacting the polymer, the method comprising transferring charge between the non-contact electrode and a portion of the polymer through a non-condensed medium to thereby operate the electroactive polymer wherein the non-contact electrode comprises a charge source that transmits charge directly to a surface of the polymer.

26. The method of claim 25 wherein transferring the charge comprises generating the charge at a first voltage.

27. The method of claim 26 further comprising raising energy of the charge with a bias voltage.

28. The method of claim 25 wherein the charge is transferred from the non-contact electrode to the polymer.

29. The method of claim 28 wherein the charge is used to cancel opposite charge supplied by a contact electrode attached to the polymer.

30. The method of claim 25 wherein the non-condensed medium comprises one of air, a gas, a liquid, a super critical fluid, an ionized gas, and an inert gas.

31. The method of claim 25 wherein the non-condensed medium is a vacuum.

32. The method of claim 25 wherein the charge comprises an ion.

33. The method of claim 32 wherein the ion is positive.

34. The method of claim 25 wherein the non-contact electrode receives the charge from the polymer.

35. The method of claim 25 wherein the charge comprises an electron.

36. The method of claim 25 further comprising directing the flow of charge between the non-contact electrode and the portion of the electroactive polymer using an array of pins.

37. A device for converting between electrical energy and mechanical energy, the device comprising:

an electroactive polymer capable of converting between electrical energy and mechanical energy; and at least two electrodes in electrical communication with the electroactive polymer, wherein one of the at least two electrodes is a non-contact electrode, having a portion proximate to the electroactive polymer, that transfers charge to or from a portion of the polymer through air without contacting the polymer and wherein the non-contact electrode comprises a charge source that transmits charge directly to a surface of the polymer.

38. The device of claim 1, wherein the electroactive polymer has an elastic modulus below about 100 MPa.

39. The device of claim 1, wherein the electroactive polymer is adapted for elastically deforming from a first position with a first area to a second position with a second area and wherein an area strain between the first position and the second position is at least about 10%.

40. The device of claim 1, wherein the device is employed in one or more of a Braille display, a relief map, an inkjet printer, a display, an optical switching system, reconfigurable mold and an adaptive optics system.

41. A device for converting between electrical energy and mechanical energy, the device comprising:

an electroactive polymer capable of converting between electrical energy and mechanical energy; and at least two electrodes in electrical communication with the electroactive polymer, wherein one of the at least two electrodes is a non-electrode, have a portion proximate to the electroactive polymer, that transfers charge to or from a portion of the polymer through a non-condensed medium without contacting the polymer wherein the portion of the non-contact electrode proximate to the electroactive polymer comprises a sharp tipped metal.

42. A device for converting between electrical energy and mechanical energy, the device comprising:

an electroactive polymer capable of converting between electrical energy and mechanical energy;

at least two electrodes in electrical communication with the electroactive polymer, wherein one of the at least two electrodes is a non-contact electrode, having a portion proximate to the electroactive polymer, that transfers charge to or from a portion of the polymer through a non-condensed medium without contacting the polymer; and an array of pins that direct the flow of charge between the non-contact electrode and one or more areas on the electroactive polymer.

43. A device for converting between electrical energy and mechanical energy, the device comprising:

an electroactive polymer capable of converting between electrical energy and mechanical energy; and at least two electrodes in electrical communication with the electroactive polymer, wherein one of the least two elcetrodes is a non-contact electrode, haveing a portion proximate to the electroactive polymer, that transfers charge to or from a portion of the polymer through a non-condensed medium without contacting the polymer wherein the electroactive polymer has an elastic modulus below about 100 MPa.

44. A device for converting between electrical energy and mechanical energy, the device comprising:

an electroactive polymer capable of converting between electrical energy and mechanical energy; and at least two electrodes in electrical communication wilth the electroactive polymer, wherein one of the at least two electrodes is a non-contact electrode, haveing a portion proximate to the electroactive polymer, that transfers charge to or from a portion of the polymer through a non-condensed medium without contacting the polymer wherein the electroactive polymer is adapted for elastically deforming from a first position with a first area to a second position with a second area and wherein an area strain between the first position and the second position is at least about 10%.

* * * * *